(12) United States Patent
Babich et al.

(10) Patent No.: US 7,077,903 B2
(45) Date of Patent: Jul. 18, 2006

(54) ETCH SELECTIVITY ENHANCEMENT FOR TUNABLE ETCH RESISTANT ANTI-REFLECTIVE LAYER

(75) Inventors: Katherina E. Babich, Chappaqua, NY (US); Scott D. Halle, Hopewell Junction, NY (US); David V. Horak, Essex Junction, VT (US); Arpan P. Mahorowala, Bronxville, NY (US); Wesley C. Natzle, New Paltz, NY (US); Dirk Pfeiffer, Dobbs Ferry, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 10/705,577

(22) Filed: Nov. 10, 2003

(65) Prior Publication Data

US 2005/0098091 A1 May 12, 2005

(51) Int. Cl.
*C30B 25/02* (2006.01)

(52) U.S. Cl. .............................. 117/94; 117/95; 117/96; 428/200

(58) Field of Classification Search ................. 117/94, 117/95, 96; 428/200
See application file for complete search history.

(56) References Cited

U.S. PATENT DOCUMENTS

| | | | |
|---|---|---|---|
| 5,838,055 A | 11/1998 | Kleinhenz et al. | |
| 5,876,879 A | 3/1999 | Kleinhenz et al. | |
| 6,074,951 A | 6/2000 | Kleinhenz et al. | |
| 6,147,009 A | 11/2000 | Grill et al. | |
| 6,316,167 B1 | 11/2001 | Angelopoulos et al. | |
| 6,514,667 B1 | 2/2003 | Angelopoulos et al. | |
| 2004/0185583 A1* | 9/2004 | Tomoyasu et al. | 438/8 |
| 2005/0039681 A1* | 2/2005 | Fukiage | 118/723 E |
| 2005/0100682 A1* | 5/2005 | Fukiage et al. | 427/569 |
| 2005/0100683 A1* | 5/2005 | Fukiage et al. | 427/569 |

* cited by examiner

*Primary Examiner*—Robert Kunemund
(74) *Attorney, Agent, or Firm*—Yuanmin Cai, Esq.; Hoffman, Warnick & D'Alessandro LLC

(57) ABSTRACT

Methods for generating a nanostructure and for enhancing etch selectivity, and a nanostructure are disclosed. The invention implements a tunable etch-resistant anti-reflective (TERA) material integration scheme which gives high etch selectivity for both etching pattern transfer through the TERA layer (used as an ARC and/or hardmask) with etch selectivity to the patterned photoresist, and etching to pattern transfer through a dielectric layer of nitride. This is accomplished by oxidizing a TERA layer after etching pattern transfer through the TERA layer to form an oxidized TERA layer having chemical properties similar to oxide. The methods provide all of the advantages of the TERA material and allows for high etch selectivity (approximately 5–10:1) for etching to pattern transfer through nitride. In addition, the methodology reduces LER and allows for trimming despite reduced photoresist thickness.

20 Claims, 3 Drawing Sheets

ETCH SELECTIVITY ENHANCEMENT FOR TUNABLE ETCH RESISTANT ANTI-REFLECTIVE LAYER

BACKGROUND OF THE INVENTION

1. Technical Field

The present invention relates generally to semiconductor processing, and more particularly to a method for enhancing etch selectivity for a tunable etch resistant anti-reflective (TERA) layer and a method of generating a nanostructure and a nanostructure such as a gate stack.

2. Related Art

Microelectronic devices are continually made smaller-and-smaller. To fabricate ever smaller devices, new lithographic tools, materials and processes are being considered. Currently, 193 nm lithography is being pursued to print sub-110 nm features. To do this, tools with higher numerical aperture (NA) are emerging. The higher NA allows for improved resolution but reduces the depth of focus of aerial images projected onto the photoresist. Because of the reduced depth of focus, a thinner photoresist is required.

Typical photoresist structures consist of a photoresist layer on top of an antireflective coating (ARC). The photoresist is exposed and developed and the image is then transferred through the ARC and then through the underlying silicon dioxide (hereinafter "oxide"), silicon nitride (hereinafter "nitride") or silicon layers. Typical photoresist thickness is on the order of 2000–2500 A for the current state-of-the-art lithography process. During the ARC open, significant resist is lost as the etch selectivity between the photoresist and ARC is at best 1:1. "Etch selectivity" is a ratio of an amount of an etch-target material etched away versus an amount of photoresist etched away in a single etching step.

As minimum feature size continues to decrease, it is desirable to thin the photoresist to attain the high resolution as well as improve process window exposure and focus latitude. Unfortunately, as the thickness of the photoresist is decreased, the photoresist becomes less effective as a mask for subsequent dry etch image transfer to the underlying substrate, i.e., most if not all of the resist is etched away during the subsequent pattern transfer process. In other words, there will be insufficient photoresist to function as an etch mask for subsequent transfer etch into the oxide, nitride or silicon layer. Compounding this problem is the fact that significant photoresist loss also occurs during the ARC open.

In a typical dielectric mask open etch, there are two types of etching steps as follows: Etching type I including pattern transfer through an ARC with etch selectivity to the patterned photoresist, and etching type II including pattern transfer through a dielectric layer (i.e., open mask) requiring etch selectivity to the remaining resist/ARC layer. For current generation (193 nm) device fabrication and for etching type I, etch selectivity for photoresists and ARCs varies from 0.5 to 1.5. In contrast, for etching type II, etch selectivity ranges from 1 to 10 where, for example, the dielectric is thermal oxide or TEOS or high temperature oxide (HTO). However, for etching type II where the dielectric is nitride, current etch selectivity's are very limited, typically about 1–2.

This situation presents a challenge for the next device generation (65 nm) and beyond because integration schemes for this generation of devices are likely to require patterning of nitride layers for the poly/metal conductor/gate (PC) level. Techniques for patterning the PC level of the current generation and beyond with, for example, less than 200 nm of photoresist thickness via mask open shall require higher etch selectivity for etching type II of nitride than currently available.

Reduced photoresist thickness also creates other problems. First, reduced photoresist thickness tends to increase line edge roughness (LER) of the photoresist. The LER of the imaged photoresist and the pattern transfer through dielectric mask open can contribute to overall critical dimension (CD) variation of lines. Second, reduced photoresist thickness hinders the ability to trim. "Trimming" is a common method for reducing the linewidth of the polysilicon/metal gate level (for speedier device performance), which employs a dry etch process during pattern transfer of the photolithographic pattern in which the organic ARC is both opened (cleared to the bottom of the arc) and reduced in width (along with the remaining resist). This process typically has a vertical to lateral component of 3:1. Accordingly, the amount of trim available is limited by resist thickness. Current techniques for patterning PC level for the 65 nm generation of devices and beyond, with less then 200 nm of photoresist thickness, severely restricts the ability to trim, which is critical to device performance.

One possible approach to address reduced photoresist thickness is to implement a complex set of sequential etching steps through an ARC, and intermediate hard mask such as oxide (e.g., TEOS) and silicon nitride layers, using current integration methodology. However, satisfactory implementation of this approach is very difficult to achieve.

Concurrent to the emergence of the above photoresist thickness reduction problem, a new ARC material has been developed as disclosed in U.S. Pat. Nos. 6,26,167 and 6,514,667, both to Angelopoulus et al., which are hereby incorporated by reference. In these disclosures, a photoresist is provided on top of a plasma-enhanced chemical vapor deposited (PECVC) ARC. The ARC provides significantly better etch selectivity to the photoresist (>1:1) and does not interact with the photoresist in a negative fashion inducing footing, undercutting or residue as is characteristic of silicon oxy nitride ARC. The improved ARC material may have composition R:C:H:X wherein R is selected from Si, Ge, B, Sn, Fe, Ti and mixtures of these elements and X is selected from O, N, S, F and mixtures of these elements and X is optionally present. The optical properties of the vapor deposited ARC can be tuned by variations in the deposition process. Furthermore, the optical properties can also be tuned within the film thickness thereby forming a graded ARC. The vapor deposited ARC also functions as a hardmask or as a combined ARC-hardmask. In view of the foregoeing, the structure is referred to herein as a tunable etch-resistant anti-reflective (TERA) material. Unfortunately, while the TERA material provides excellent optical properties as an ARC, when used as hardmask, it provides good etch selectivity for etching type I (approximately 1.5 to 2.5), but inadequate etch selectivity etching type II of nitride (approximately 2).

In view of the foregoing, there is a need in the art for a methods and materials that address the problems of the related art.

SUMMARY OF THE INVENTION

The invention includes methods for generating a nanostructure such as a gate and for enhancing etch selectivity, and a nanostructure such as a gate stack. The invention implements a TERA material integration scheme which gives high etch selectivity for both etching type I and type II of nitride. This is accomplished by oxidizing a TERA layer after etching type I to form an oxidized TERA layer having chemical properties similar to oxide. The methods provide all of the advantages of the TERA material and allows for high etch selectivity (approximately 5 to 10) for etching type II of nitride. In addition, the methodology reduces LER and allows for trimming despite reduced photoresist thickness.

A first aspect of the invention is directed to a method of generating a nanostructure, the method comprising the steps of: depositing on a surface of a substrate a plurality of layers at least one of which is a tunable etch resistant anti-reflective (TERA) layer; patterning through the TERA layer; oxidizing a remaining portion of the TERA layer to generate an oxidized TERA layer; and generating the nanostructure in the plurality of layers using the oxidized TERA layer as a mask.

A second aspect of the invention is directed to a method of generating a gate, the method comprising the steps of: depositing on a surface of a substrate a plurality of layers including a polysilicon layer on the surface, a silicon nitride layer on the polysilicon layer and a tunable etch resistant anti-reflective (TERA) layer on the silicon nitride layer; patterning the TERA layer; oxidizing a remaining portion of the TERA layer to generate an oxidized TERA layer; and generating the gate in the silicon nitride layer and the polysilicon layer using the oxidized TERA layer as a mask.

A third aspect of the invention is directed to a nanostructure comprising: a plurality of layers, at least one of which is an oxidized tunable etch anti-reflective (TERA) layer.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

As noted above, U.S. Pat. Nos. 6,26,167 and 6,514,667, both to Angelopoulus et al., disclose a chemical vapor deposited (CVD) anti-reflecting coating (ARC) material having composition R:C:H:X wherein R is selected from Si, Ge, B, Sn, Fe, Ti and mixtures of these elements and X is selected from O, N, S, F and mixtures of these elements and X is optionally present. The structure disclosed includes a photoresist deposited on top of the ARC material. The optical properties of the vapor deposited ARC material can be tuned by variations in the deposition process, and the optical properties can also be tuned within the film thickness thereby forming a graded ARC. The ARC material also functions as a hardmask or as a combined ARC-hardmask. For purposes of this invention, the above-described material shall be referred to as a tunable etch-resistant anti-reflective (hereinafter "TERA") material. By "tunable" is meant, as described in the Angelopoulus et al. references, that the material has a selectively adjustable index of refraction and extinction coefficient, which can be optimally graded along the film thickness to match the optical properties of the substrate and the imaging resist. The invention includes a form of TERA including silicon (Si), carbon (C), hydrogen (H) and oxygen. In one embodiment, the stoichiometry of the TERA material may be Si~22, C~22, H~51, O~5, which is carbon and hydrogen rich.

"Etching type I" as used herein refers to pattern transfer through an ARC with etch selectivity to the patterned photoresist, and "etching type II" refers to pattern transfer through a dielectric layer (i.e., open mask) requiring etch selectivity to the remaining resist/ARC layer. The TERA material exhibits both the optical properties of a high performance ARC and provides etch selectivity's for etching type I and etching type II to oxide of 1.5 and 2–10, respectively. Unfortunately, the TERA material's etch selectivity for etching type II to nitride is in the range of 1–2.

In accordance with the invention, the TERA material is converted (i.e., has its stoichiometry changed) from a hydrogen/carbon rich material to a hydrogen/carbon poor material, essentially making the material properties very similar to silicon-dioxide ($SiO_2$ or "oxide"), which enables a high etch selectivity for etching type II of silicon nitride. In one embodiment, the CVD deposited TERA material is exposed to an oxygen plasma in a typical photoresist ashing tool, which allows for the stoichiometry to change. In one embodiment, the resulting oxide-like material has a stoichiometry of approximately Si~48, C~4, H~0, O~48.

Figure 5:
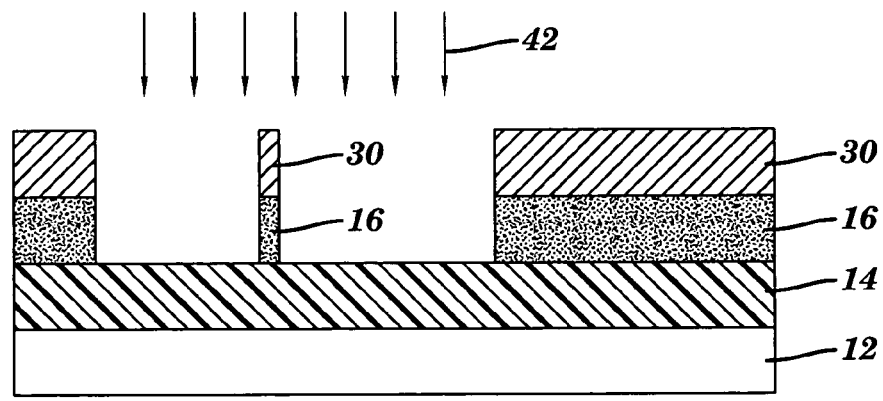
FIG. 5 shows a first part of a fifth step including etching of a nitride layer.
Figure 6:
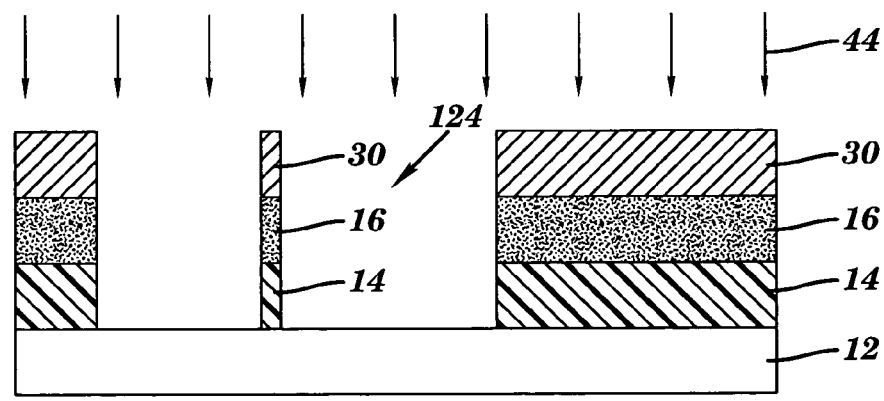
FIG. 6 shows a second part of the fifth step including etching of a polysilicon layer to form a nanostructure in the form of a gate stack.
Figure 7:
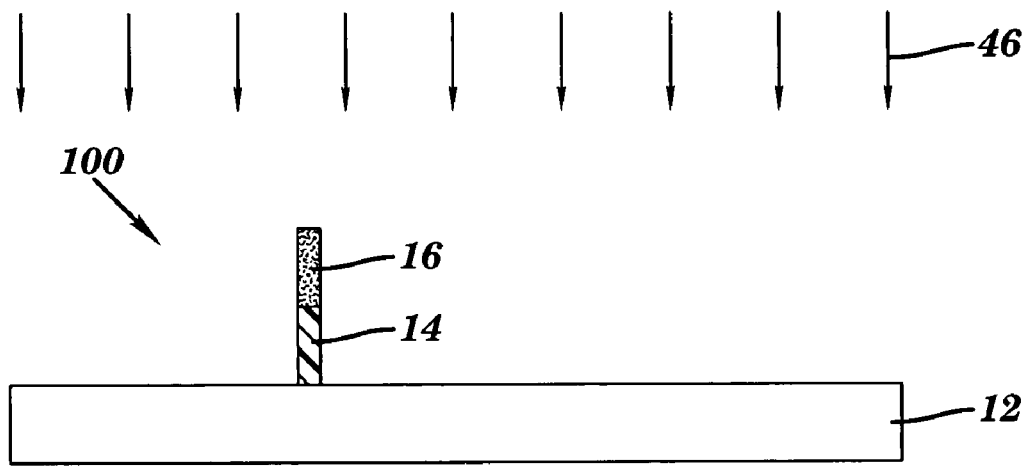
FIG. 7 shows a transistor gate, or nanostructure, generated according to the methods of FIGS. 1–6.

Referring to FIGS. 1–7, one embodiment of a pattern transfer integration scheme is illustrated. In this illustrative embodiment, in a first step shown in FIG. 1, a plurality of layers 8 at least one of which is a TERA layer 18 are deposited on a surface 10 of a substrate 12. In one embodiment, the integration scheme is implemented to generate a transistor gate 100 (FIG. 7). In this case, substrate 12 includes silicon, layer 14 includes polysilicon, layer 16 includes silicon nitride, layer 18 is the TERA layer and layer 20 includes a photoresist. For purposes of description, thicknesses of materials may be, for example: photoresist layer 20—approximately 180 nm (possible shrinkage to about 150 nm), TERA layer 18—approximately 60–120 nm, nitride layer 16—approximately 40 nm, and polysilicon layer approximately 100 nm. It should be recognized that thicknesses will vary from process-to-process and are not meant to be limiting.

Figure 1:
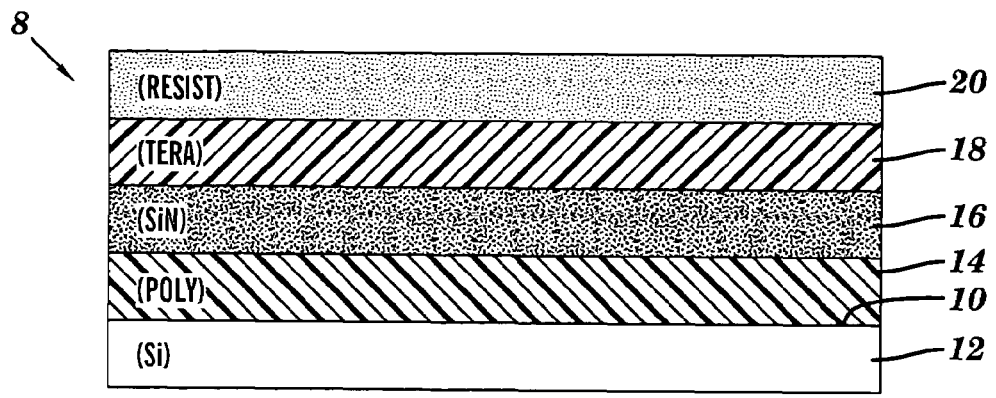
FIG. 1 shows a first step of the methods including depositing of a plurality of layers.
Figure 2:
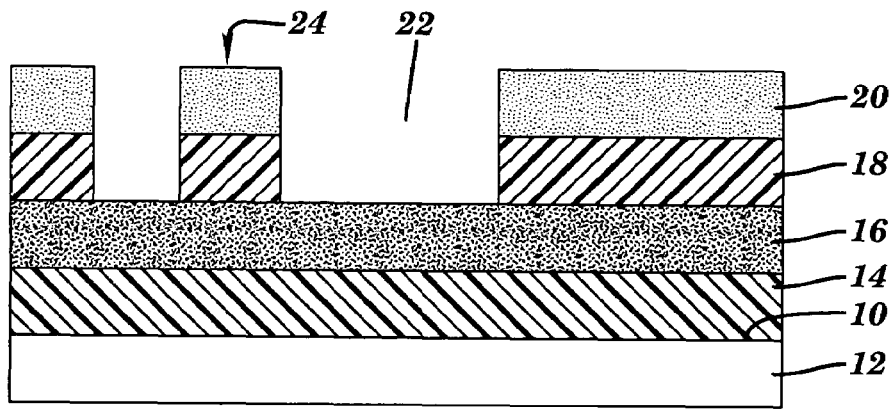
FIG. 2 shows a second step including patterning through a TERA layer.

In a next step, shown in FIG. 2, patterning through TERA layer 18 is conducted. That is, photoresist layer 20 is imaged on top of TERA layer 18 and an exposed area 22 of TERA layer 18 is removed. This step may include, for example, imaging photoresist layer 20 and transferring the image through TERA layer 18 using etch processes outlined in U.S. Pat. Nos. 6,26,167 and 6,514,667. As an optional step, imaged photoresist layer 20 may be etched to trim the image using, for example, a dry etch prior to transfer through TERA layer 18. For example, a feature 24 may be trimmed from, for example, approximately 60 nm to approximately 30 nm. This etching may leave, for example, only 100 nm of photoresist layer 20. Replacing TERA layer 18, however, may reduce photoresist layer thickness more significantly with organic ARC.

Figure 3:
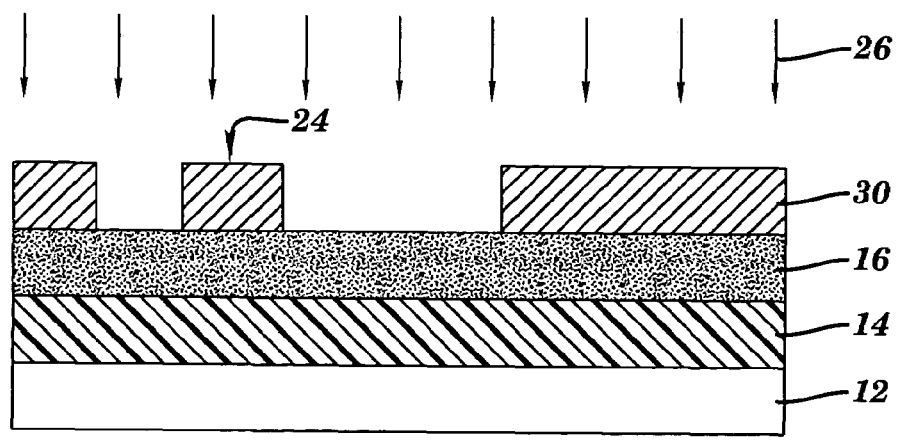
FIG. 3 shows a third step including oxidization of the TERA layer.

In a next step shown in FIG. 3, TERA layer 18 is oxidized to convert it to an oxidized TERA layer 30. Also during this step, the remaining photoresist layer (not shown) is removed. In one embodiment, plurality of layers 8 are exposed to an oxygen plasma 26 in a typical photoresist ashing tool, which allows for the stoichiometry of TERA layer 18 to change. That is, a remaining portion of TERA layer 18 is oxidized to generate oxidized TERA layer 30. In one embodiment, the structure is fully oxidized when the wafer is heated to greater than or equal to approximately 250° C. and exposed to a downstream oxygen ($O_2$) plasma. Gases such as carbon tetrafluoride ($CF_4$) and a forming gas available on downstream plasma etchers might also be used. An example of a 200 mm tool may that available from Mattson™ and an example 300 mm may be that available from Axcelis™ such as model ES3i. Typical processing conditions for the Mattson™ tool are: 1.1 Torr, 900 W, 4000 $O_2$, 200 forming gas (5% $H_2$ and $N_2$), 250° C. and 120 seconds. During this process, the TERA film loses almost all carbon (C) and hydrogen (H) and oxidized TERA layer 30, which consists essentially of silicon and oxygen, making the material properties very similar to silicon-dioxide (SiO or "oxide"). As a result, oxidized TERA layer 30 provides a suitable hard mask for nitride layer 16 and polysilicon layer 14 and enables a high etch selectivity for etching of nitride layer 16. As noted above, in one embodiment, the resulting oxide-like material has a stoichiometry of approximately Si~48, C~4, H~0, O~48. It should be recognized that this step may occur in other formats that result in an oxidized TERA layer 30 and not depart from the teachings of the invention.

Figure 4:
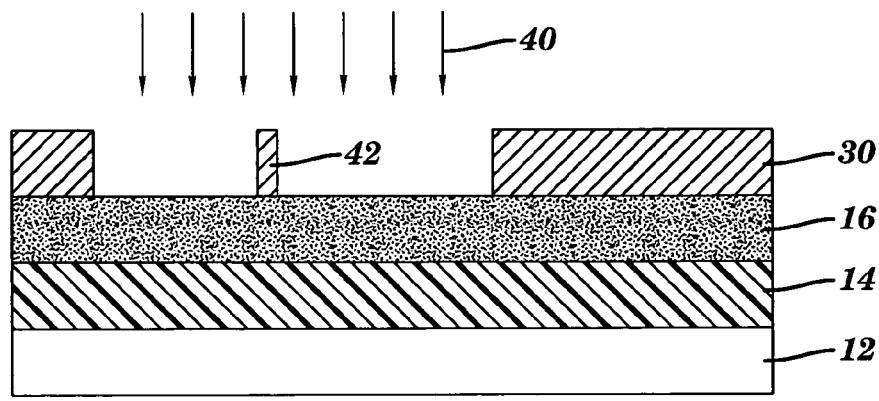
FIG. 4 shows a fourth optional step of trimming.

FIG. 4 illustrates an optional step in which oxidized TERA layer 30 is implemented in a trim process despite a reduced photoresist layer 18 thickness. In contrast to the non-organic TERA material, oxidized TERA layer 30 can be easily trimmed. In one embodiment, trimming is provided by isotropically etching oxidized TERA layer 30 with neutral molecules from a gaseous hydrogen fluoride/ammonia mixture 40 to trim oxidized TERA layer 30. This process is more fully described in U.S. Pat. Nos. 5,838,055, 5,874,879 and 6,074,951 to Kleinhenz et al., which are all hereby incorporated by reference. A resulting image structure 42 may be, for example, approximately 10 nm to 40 nm wide. The above-described alternative step enables the TERA material to be used for future generations of polysilicon/metal gate levels requiring aggressively small gate lengths.

FIGS. 5–6 show a next step in which a nanostructure 124 (FIG. 6) such as a gate stack is generated. In the gate example, this step may include transferring the image to polysilicon layer 14 using standard oxide to nitride etch selective chemistry, e.g., 5–10:1. As illustrated in FIGS. 5–6, this step may be segmented into patterning nitride layer 16 (FIG. 5) with standard oxide to nitride etch selective chemistry 42 (>10:1), and then polysilicon layer 14 (FIG. 6) via standard gate etching 44. A final step shown in FIG. 7 may include stripping oxidized TERA layer (not shown) using any standard wet oxide etch chemistry to form a transistor gate 100.

The above-described process induced etch selectivity enhancement can simplify integration schemes. For example, instead of requiring a stack consisting of ARC (either organic, inorganic or SiC type), oxide such as LPTEOS, and nitride above the gate conductor, the TERA material can eliminate the need for the oxide deposition. Since there is one less etching layer, the etch requirements are somewhat relaxed and simplified. The TERA material can be deposited directly on the nitride. As an additional benefit for using oxidized TERA layer 30 for the nitride etch, the sidewall roughness in oxidized TERA layer 30 is significantly smoother than an un-oxidized TERA material or a TEOS. For example, the average surface roughness for a sample of TERA is 0.538 nm (maximum 6.886 nm), for oxidized TERA is 0.343 nm (maximum 3.998 nm) and for TEOS is 3.353 nm (maximum 32.997 nm). In one embodiment, the nanostructure has a surface roughness of no greater than approximately 4.0 nm rms. The smoothing of the sidewall is expected to have a significant effect on reducing the LER of the patterned photoimage.

While the invention has been described relative to pattern transfer to nitride, it should be recognized that oxidized TERA layer 30 may be used as a mask for transfer into, for example, at least one layer selected from the group consisting of Si, Ge, SiGe, an oxide, a nitride and a metal.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of generating a nanostructure, the method comprising the steps of:
   depositing on a surface of a substrate a plurality of layers at least one of which is a tunable etch resistant anti-reflective (TERA) layer;
   patterning through the TERA layer;
   oxidizing a remaining portion of the TERA layer to generate an oxidized TERA layer; and
   generating the nanostructure in the plurality of layers using the oxidized TERA layer as a mask.

2. The method of claim 1, wherein the plurality of layers includes a polysilicon layer on the surface, a silicon nitride layer on the polysilicon layer, the TERA layer on the silicon nitride layer, and a photoresist on the TERA layer.

3. The method of claim 2, wherein patterning step includes imaging the photoresist layer and removing an exposed area of the TERA layer.

4. The method of claim 3, further comprising the step of etching the photoresist layer to trim an image in the photoresist layer prior to removing the exposed area of the TERA layer.

5. The method of claim 2, wherein the nanostructure generating step further includes using the oxidized TERA layer as a mask for etching of the nitride and polysilicon layers, and stripping the oxidized TERA layer.

6. The method of claim 1, wherein the nanostructure has a surface roughness of no greater than approximately 4.0 nm rms.

7. The method of claim 1, wherein the nanostructure generating step includes trimming the oxidized TERA layer with neutral molecules from a gaseous hydrogen fluoride/ammonia mixture.

8. The method of claim 1, wherein the oxidizing step includes oxidizing in a plasma at approximately 250° C., and includes removal of a photoresist layer.

9. The method of claim 1, wherein the TERA layer includes carbon, hydrogen, oxygen and silicon, and the oxidized TERA layer consisting essentially of oxygen and silicon.

10. A method of enhancing optical properties and etch selectivity during nanostructure fabrication, the method comprising the steps of:
- depositing a tunable etch resistant anti-reflective (TERA) layer including carbon, hydrogen, oxygen and silicon;
- patterning the TERA layer as a mask for etching; and
- enhancing etch selectivity to silicon nitride by oxidizing the TERA layer to form an oxidized TERA layer consisting essentially of oxygen and silicon.

11. The method of claim 10, wherein the depositing step includes depositing on a surface of a substrate a plurality of layers including a polysilicon layer on the surface, a silicon nitride layer on the polysilicon layer and the TERA layer on the silicon nitride layer;
- patterning the TERA layer; and
  - wherein the method further comprises the step of:
    - generating a nanostructure in the silicon nitride layer and the polysilicon layer
  - using the oxidized TERA layer as a mask.

12. The method of claim 10, wherein patterning step includes:
- depositing a photoresist on the TERA layer;
- photolithographically printing to generate a photoresist mask; and
- removing an exposed area of the TERA layer.

13. The method of claim 12, further comprising the step of etching to trim the photoresist mask.

14. The method of claim 10, further comprising the step of trimming the oxidized TERA layer with neutral molecules from a gaseous hydrogen fluoride/ammonia mixture.

15. The method of claim 14, wherein the gate generating step further includes at least one etching of the silicon nitride layer and the polysilicon layer using the oxidized TERA layer as a mask.

16. The method of claim 10, further comprising the step of stripping the oxidized TERA layer using wet oxide etch chemistry.

17. The method of claim 10, wherein the oxidizing step includes oxidizing in a plasma at approximately 250° C.

18. A nanostructure comprising:
- a plurality of layers, at least one of which is an oxidized tunable etch anti-reflective (TERA) layer.

19. The nanostructure of claim 18, wherein the plurality of layers includes a polysilicon layer on a surface of a substrate, a silicon nitride layer on the polysilicon layer and the TERA layer on the silicon nitride layer.

20. The nanostructure of claim 18, wherein the nanostructure has a surface roughness of no greater than approximately 4.0 nm.

* * * * *